United States Patent
Hoang et al.

(10) Patent No.: US 7,710,299 B2
(45) Date of Patent: May 4, 2010

(54) SYSTEM AND METHOD PROVIDING CHANNEL MULTIPLEXING FOR ANALOG-TO-DIGITAL CONVERSION

(75) Inventors: Chinh Luong Hoang, San Diego, CA (US); Burcin Serter Ergun, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 12/157,436

(22) Filed: Jun. 9, 2008

(65) Prior Publication Data

US 2009/0115651 A1    May 7, 2009

Related U.S. Application Data

(60) Provisional application No. 60/984,672, filed on Nov. 1, 2007.

(51) Int. Cl.
*H03M 1/00* (2006.01)
(52) U.S. Cl. .................... 341/141; 341/155
(58) Field of Classification Search ............ 341/141
See application file for complete search history.

(56) References Cited

U.S. PATENT DOCUMENTS

| | | | | |
|---|---|---|---|---|
| 4,156,286 | A * | 5/1979 | Connors et al. | 365/45 |
| 4,972,190 | A * | 11/1990 | Primeau et al. | 341/155 |
| 6,943,714 | B2 * | 9/2005 | White | 341/141 |
| 7,132,971 | B2 * | 11/2006 | Min et al. | 341/155 |
| 7,135,998 | B2 * | 11/2006 | Fey et al. | 341/118 |
| 7,321,399 | B2 * | 1/2008 | Rumreich | 348/572 |

* cited by examiner

*Primary Examiner*—Khai M Nguyen
(74) *Attorney, Agent, or Firm*—Farjami & Farjami LLP

(57) ABSTRACT

There is provided a demodulator system comprising a first input to receive a first analog signal at a first rate; a second input to receive a second analog signal at the first rate; a MUX coupled to the first input and the second input to receive the first analog signal and the second analog signal, and to multiplex the first analog signal and the second analog signal to generate a multiplexed analog output; an ADC to receive the multiplexed analog output and generate a multiplexed digital output, the ADC operating at a second rate, the second rate substantially equal to the first rate multiplied by a total number of input analog signals; a DEMUX to receive the multiplexed digital output and generate a first digital output having a first bitstream and a second digital output having a second bitstream corresponding to the first analog signal and the second analog signal.

16 Claims, 5 Drawing Sheets

SYSTEM AND METHOD PROVIDING CHANNEL MULTIPLEXING FOR ANALOG-TO-DIGITAL CONVERSION

RELATED APPLICATIONS

This application claims priority from U.S. Provisional Application No. 60/984,672, filed on Nov. 1, 2007, which is hereby incorporated by reference in its entirety.

BACKGROUND OF THE INVENTION

1. Field of the Invention

The present invention relates to telecommunication receivers. More particularly, the present invention relates to analog-to-digital converters in demodulators.

2. Background Art

In telecommunications, modulation is the process of varying a periodic waveform, i.e., a tone, in order to use that signal to convey a message, in a similar fashion as a musician may modulate the tone from a musical instrument by varying its volume, timing and pitch. Typically, a high-frequency sinusoid waveform is used as carrier signal. The three key parameters of a sinusoidal or sine wave are its amplitude ("volume"), phase ("timing") and its frequency ("pitch"), all of which can be modified in accordance with a low frequency information signal to obtain the modulated signal.

A device that performs modulation is known as a modulator and a device that performs the inverse operation of modulation is known as a demodulator. In digital modulation, an analog carrier signal is modulated by a digital bit stream. Digital modulation methods can be considered as digital-to-analog conversion, and the corresponding demodulation or detection as analog-to-digital conversion. The changes in the carrier signal are chosen from a finite number of alternative symbols. The most fundamental digital modulation techniques are: phase-shift keying (PSK), frequency-shift keying (FSK), amplitude-shift keying (ASK), and Quadrature amplitude modulation (QAM).

Among these digital modulation schemes, PSK is a common digital modulation that conveys data by changing, or modulating, the phase of a reference signal or the carrier wave. PSK uses a finite number of phases, each assigned a unique pattern of binary bits. Usually, each phase encodes an equal number of bits. Each pattern of bits forms the symbol that is represented by the particular phase. The demodulator, which is designed specifically for the symbol-set used by the modulator, determines the phase of the received signal and maps it back to the symbol it represents, thus recovering the original data. This requires the receiver to be able to compare the phase of the received signal to a reference signal. Alternatively, instead of using the bit patterns to set the phase of the wave, it can instead be used to change it by a specified amount. The demodulator then determines the changes in the phase of the received signal rather than the phase itself. Since this scheme depends on the difference between successive phases, it is termed differential phase-shift keying (DPSK).

A convenient way to represent PSK schemes is on a constellation diagram. This shows the points in the Argand plane where, in this context, the real and imaginary axes are termed the in-phase (I) and quadrature-phase (Q) axes, respectively, due to their 90° separation. Such a representation on perpendicular axes lends itself to straightforward implementation. The amplitude of each point along the in-phase axis is used to modulate a cosine (or sine) wave and the amplitude along the quadrature-phase axis is used to modulate a sine (or cosine) wave. In PSK, the constellation points chosen are usually positioned with uniform angular spacing around a circle. This gives maximum phase-separation between adjacent points and thus the best immunity to corruption. The constellation points are positioned on a circle so that they can all be transmitted with the same energy. In this way, the moduli of the complex numbers they represent will be the same and thus so will the amplitudes needed for the cosine and sine waves. Two common examples are "binary phase-shift keying" (BPSK) which uses two phases, and "quadrature phase-shift keying" (QPSK), which uses four phases, although any number of phases may be used.

Now, FIG. 1 illustrates conventional QPSK receiver 100, which includes tuner 150 and demodulator 160. As shown in FIG. 1, tuner 150 receives analog signal 104, which is a composite signal with magnitude and phase (or I and Q) information. Tuner 150 includes oscillator 108 for generating a local oscillator signal at the carrier frequency, which is provided to phase modifier 110 for generating the carrier frequency at 90° and 0° phase shifts. Decomposer 106 of tuner 150 utilizes the carrier frequency at the 0° phase shift to extract the in-phase or I component of composite signal 104 that can be further processed by amplifiers and filters 112 to provide I signal 116 to demodulator 160. Also, decomposer 107 of tuner 150 utilizes the carrier frequency at the 90° phase shift to extract the quadrature or Q component of composite signal 104 that can be further processed by amplifiers and filters 114 to provide Q signal 118 to demodulator 160.

As further shown in FIG. 1, demodulator 160 includes first analog-to-digital converter (ADC) 120 and second ADC 122, which receive I signal 116 and Q signal 118, respectively, from tuner 150. First ADC 120 converts I signal 116 to I bitstream 124 and, similarly, second ADC 122 converts Q signal 118 to Q bitstream 126. Demodulator 160 also includes processor 128, which receives I bitstream 124 and Q bitstream 126 for data processing.

The conventional implementation shown by FIG. 1 has several drawbacks. One significant disadvantage of QPSK receiver 100 is that it requires two ADCs, first ADC 120 for I signal 116, and second ADC 122 for Q signal 118. Due to variabilities in the manufacturing process utilized to produce first ADC 120 and second ADC 122, they cannot be expected to be exactly the same, nor to perform identically. Consequently, operational parameters of the individual ADCs typically will be different. For example, the offset voltages $V_{osI}$ and $V_{osQ}$, and the converter gains $A_{vI}$ and $A_{vQ}$ of respective first and second ADCs 120 and 122, shown in FIG. 1, may differ. Resultant mismatches between the performance of first ADC 120 and second ADC 122 can affect the performance of demodulator 160, and in some cases may prevent demodulator 160 from performing to its operational specifications. That, in turn, may lead to lower manufacturing yield, or require further expenditures of resources flowing from the need to include additional circuitry to compensate for the variabilities.

Additional significant drawbacks to the conventional implementation shown in FIG. 1 is that ADC circuits are among the largest circuits in terms of circuit area, and among the most voracious in terms of power consumption. This is particularly true for ADC circuits used in high-speed applications. While these latter disadvantages, by themselves, are sufficient to make circuits requiring multiple ADCs quite undesirable, when taken together with the drawbacks resulting from manufacturing variability discussed previously, they make the conventional implementation shown by FIG. 1 impractical for high-speed applications.

One conventional approach to avoiding use of two ADC circuits to perform demodulation in a QPSK receiver is shown in FIG. 2. Demodulator 260, in FIG. 2 may be seen to correspond to demodulator 160, in FIG. 1. FIG. 2 shows demodulator 260 receiving I signal 216 and Q signal 218 from a tuner, not shown in FIG. 2. For the sake of simplicity, analogues to tuner 150 and its constituent elements shown in FIG. 1 are not reprised in FIG. 2. Demodulator 260 includes first sample-and-hold circuit 230 and second sample and hold circuit 232, which receive I signal 216 and Q signal 218, respectively. Demodulator 260 also includes single ADC 220 and processor 228, corresponding respectively to one of ADCs 120 or 122, and processor 128, of demodulator 160 in FIG. 1.

First and second sample-and-hold circuits 230 and 232 allow I signal 216 and Q signal 218 to have their respective values captured and delivered sequentially to ADC 220. ADC 220, which is shown to be operating at twice the frequency of first and second sample-and-hold circuits 230 and 232, then converts I signal 216 to corresponding bitstream data, and Q signal 218 to corresponding bitstream data. Processor 228 receives I and Q bitstream 224 for data processing.

The apparent advantage of the conventional solution to eliminating one ADC from a demodulator used in a QPSK receiver, shown in FIG. 2, is the absence of a second ADC. This apparent advantage is significantly qualified, however, by drawbacks introduced by the requirement that two sample-and-hold circuits be provided to mediate delivery of I signal 216 and Q signal 218 to ADC 220. Those drawbacks include offsets to the circuit area and power consumption savings achieved through elimination of one ADC, by the additional circuit area and power consumption required for implementation of the two new sample-and-hold circuits. Furthermore, while signal mismatch due to performance variations between two different ADCs is now eliminated, signal mismatch due to performance variations between two separate sample-and-hold circuits is introduced. Moreover, due to resolution losses associated with operation of ADC 220 at high frequencies in the conventional art, the requirement in demodulator 260 that ADC 220 operate at twice the frequency of first and second sample-and-hold circuits 230 and 232, limits that implementation to low to moderate frequency applications.

Accordingly, there is a need to overcome the drawbacks and deficiencies in the art by providing a demodulator for high speed applications.

SUMMARY OF THE INVENTION

A system and method providing channel multiplexing for analog-to-digital conversion, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
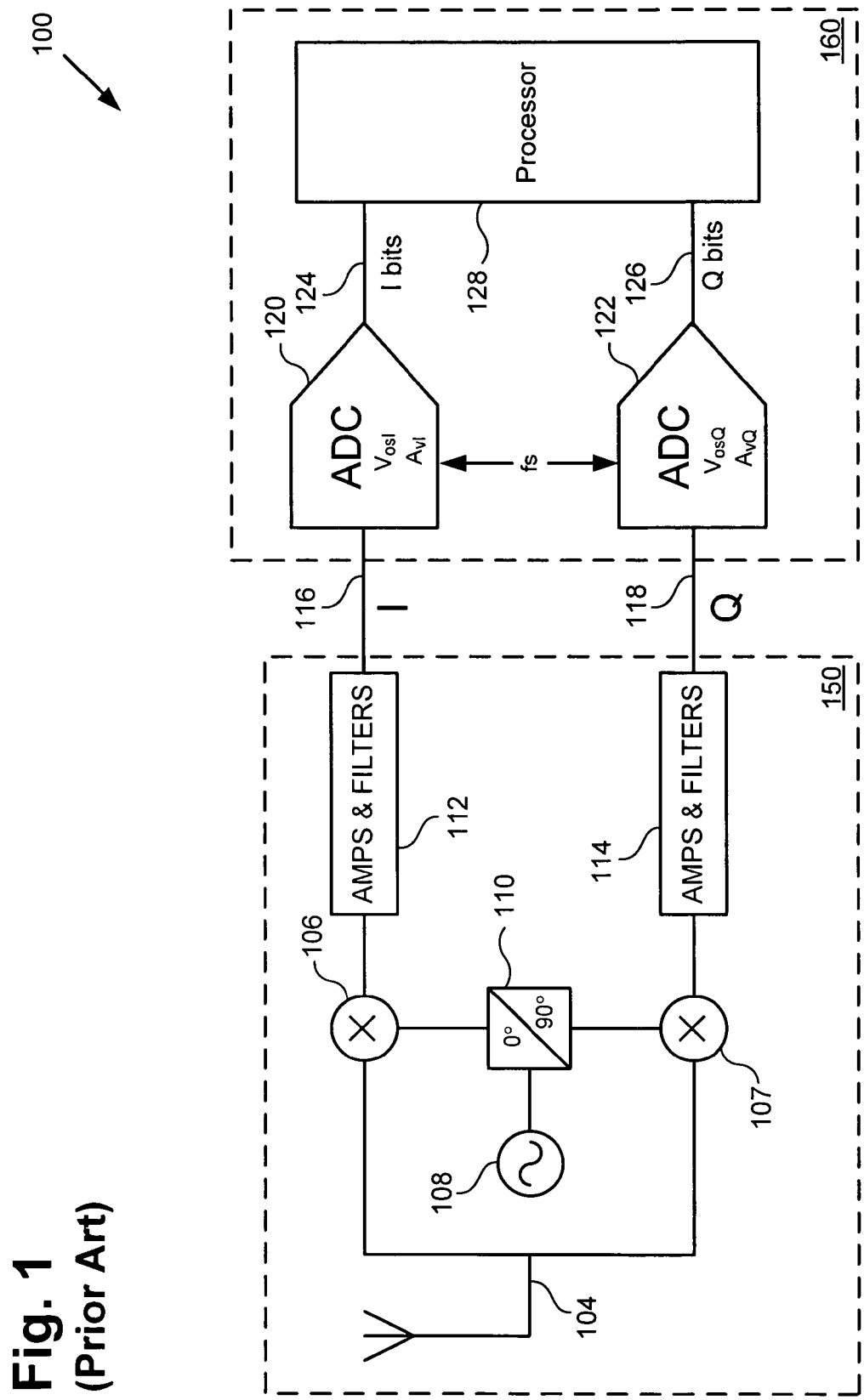
FIG. 1 shows a block diagram of a conventional quadrature phase-shift keying (QPSK) receiver including a demodulator implemented using two separate analog-to-digital converts (ADCs)

The present application is directed to a system and method providing channel multiplexing for analog-to-digital conversion. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

Figure 3A:
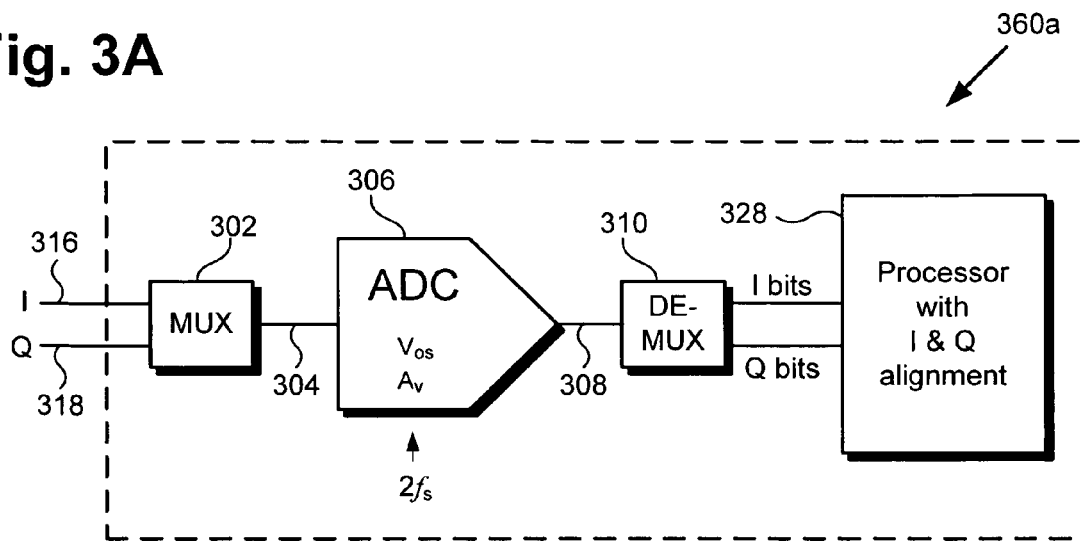
FIG. 3A is a block diagram showing a multi-channel demodulator system utilizing a shared ADC, according to one embodiment of the present invention.

FIG. 3A is a block diagram showing multi-channel demodulator 360a utilizing shared analog-to-digital converter (ADC) 306, according to one embodiment of the present invention. As shown in FIG. 3A, multi-channel demodulator 360a comprises multiplexer (MUX) 302, demultiplexer (DEMUX) 310, and baseband processor 328, in addition to shared ADC 306. Multi-channel demodulator 360a might be utilized as part of a receiver in an electronic system including a satellite set-top box or digital cable television tuner, for example. In the particular embodiment of FIG. 3A, multi-channel demodulator 360a is shown receiving input signals 316 and 318 representing, respectively, the analog I and Q signal components of a received communication signal.

As shown in FIG. 3A, MUX 302 is coupled to input signals 316 and 318. MUX 302 multiplexes the I and Q input signals into signal 304. Shared ADC 306 is coupled to the output of MUX 302, and samples signal 304 at a multi-signal sampling rate that in the present embodiment is substantially two times a single signal sampling rate. Referring to FIG. 1 for comparison, a single signal sampling rate ($f_s$) corresponds to the sampling frequency of separate ADCs 120 and 122 each sampling respective single I signal 116 and single Q signal 118. According to the embodiment of FIG. 3A, shared ADC 306 is configured to operate at a multi-signal sampling rate, in this instance a two-signal sampling rate, substantially equal to twice the sampling frequency of either ADC 120 or ADC 122, in FIG. 1, i.e. at a rate substantially equal to $2f_s$. More generally, where the number of inputs to multi-channel demodulator 360a is specified by an integer value given by "n", the multi-channel sampling rate of shared ADC 306 is substantially equal to n times the sampling frequency of either ADC 120 or ADC 122, i.e., $nf_s$.

Continuing with multi-channel demodulator 360*a*, in FIG. 3A, shared ADC 306 produces output signal 308, which comprises an interleaved sampling of the digitized I and Q input signals. These interleaved signals are then separated by DEMUX 310 and provided as I and Q output bitstreams corresponding respectively to the analog I and Q input signals 316 and 318. Baseband processor 328 is shown coupled to the outputs of DEMUX 310, and receives I and Q bitstreams for processing. Thus, multi-channel demodulator 360*a* is configured to receive analog input signals 316 and 318, and to convert the analog input signals to corresponding bit streams, utilizing shared ADC 306 operating at the multi-signal sampling rate $2f_s$ in combination with MUX 302 and DEMUX 310. By eliminating the need for multiple ADCs the circuit area, power consumption and package pin count required for implementation of a demodulator system can be reduced. Additionally, the problems due to variability in the offset voltages and converter gain of multiple ADC's described previously are eliminated.

Figure 3B:
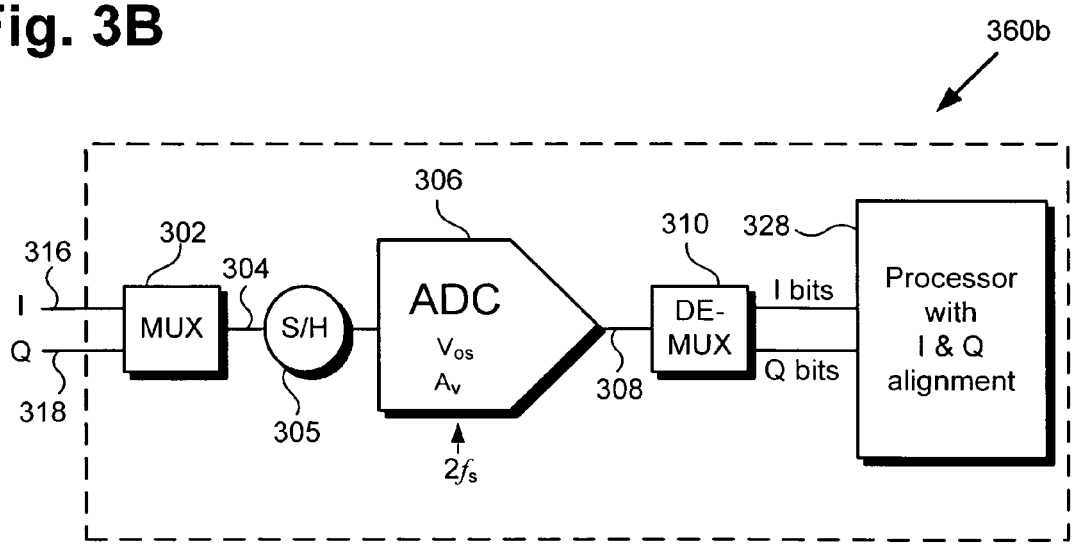
FIG. 3B is a block diagram showing a multi-channel demodulator system utilizing a shared ADC, according to another embodiment of the present invention.

Continuing with FIG. 3B, FIG. 3B is a block diagram showing multi-channel demodulator 360*b* utilizing shared ADC 306, according to another embodiment of the present invention. Many ADC architectures utilize a sample-and-hold or track/hold circuit to briefly hold the analog value of an input signal while the ADC samples the signal value. FIG. 3B illustrates sample-and-hold circuit 305 implemented in demodulator 360*b*, which, save for the presence of sample-and-hold circuit 305 corresponds to demodulator 360*a*, in FIG. 3A.

Figure 2:
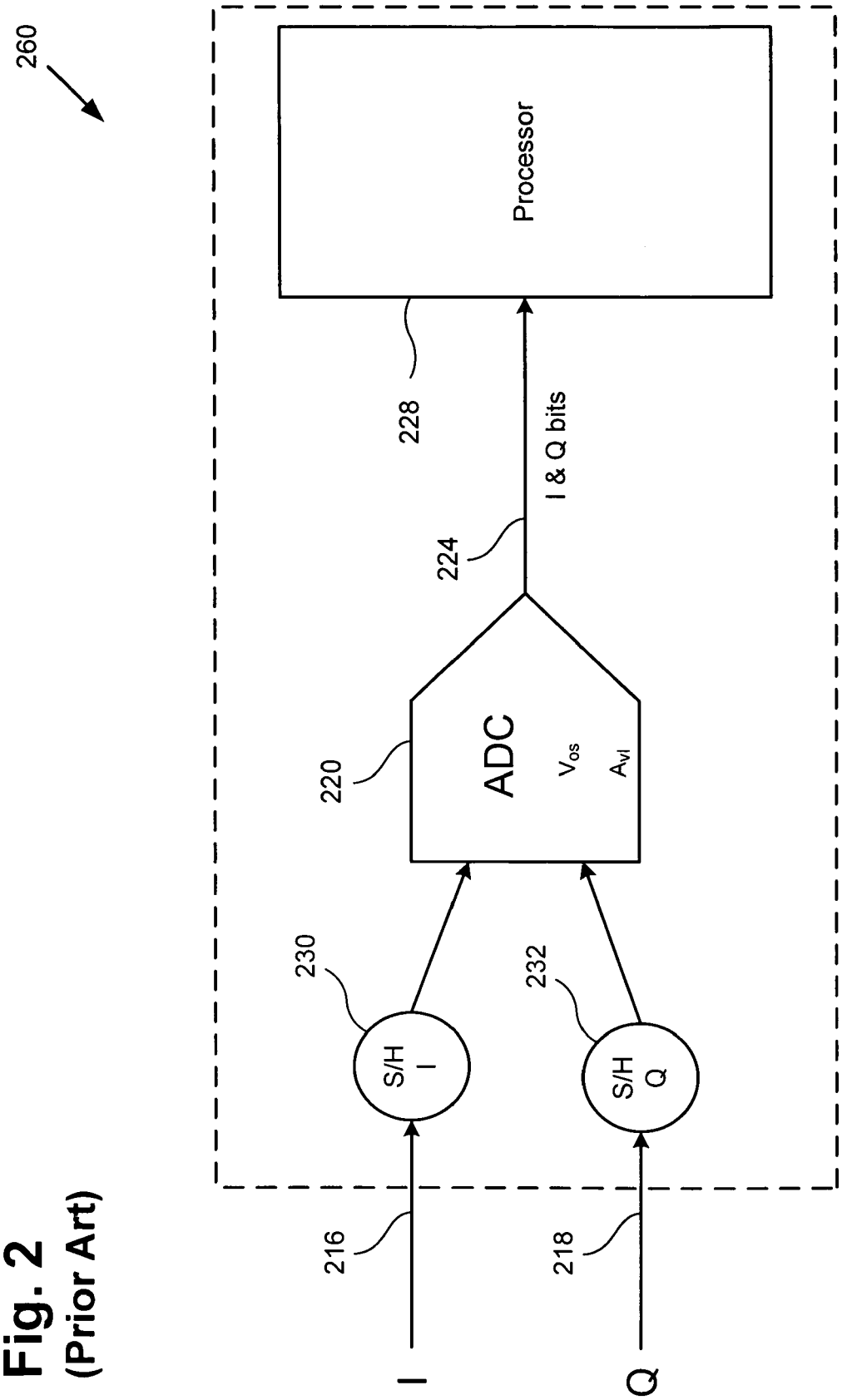
FIG. 2 is a block diagram showing a conventional approach to implementing a demodulator with a single ADC requiring two separate sample-and-hold circuits.

Comparison of the embodiment shown in FIG. 3B with the conventional system shown in FIG. 2, reveals that utilizing shared ADC 306 in combination with MUX 302 and DEMUX 310 in the present embodiment enables implementation of a demodulator requiring only one sample-and-hold circuit. Where two input signals are processed by the demodulator, as shown in FIG. 2 and FIG. 3A, the present embodiment yields a twofold improvement in circuit area and power consumption required for sample-and-hold operation. This may be seen to define the lower bound of the advantages accruing from the various embodiments of the present invention, however. For example, in the more general implementation in which a demodulator receives a plurality of input signals specified by the integer n, the conventional implementation shown by demodulator 260 in FIG. 2 would require n separate sample-and-hold circuits. By contrast, due to the multiplexing functionality of the various embodiments of the present invention, even for n inputs, there need be only one sample-and-hold circuit for sample-and-hold operations to be supported.

Thus, for the generalized case, one embodiment of the present invention yields an n−1 fold improvement in circuit area and power consumption required for sample-and-hold operation in the demodulator. It may be readily understood that the described advantages flowing from the various embodiments of the present invention are even greater when compared to conventional systems utilizing multiple sample-and-hold circuits and multiple ADCs. It is noted that in some embodiments of the present invention, the sample-and-hold circuit may be integrated into the ADC circuit, such as shared ADC 306, and would not be shown as separate sample-and-hold circuit 305.

One potential complication introduced by multiplexing input signals into a shared ADC is that a skew can arise. The presence of skew may be illustrated by comparing sampling operation in the conventional demodulator shown in FIG. 1, with that occurring in the embodiments of the present invention shown in FIGS. 3A and 3B. According to the conventional system shown in FIG. 1, for example, both the analog I and Q signals are sampled every t nanoseconds where (t=1/$f_s$). In the embodiments of the present invention shown in FIGS. 3A and 3B, by contrast, shared ADC 306 operates at $2f_s$. Consequently, while the I signal is sampled at t=0, t, 2t, 3t, . . . in the present embodiments, as it is in the system of FIG. 1, the Q signal is sampled half a period later at t=t/2, 3t/2, 5t/2, . . . , resulting in skew.

The presence of skew may or may not be significant, depending on the nature of the input signals being processed. Where the input signals are independent of one another, as may be the case for separate cable television inputs to demodulator 360*a* or 360*b*, in FIGS. 3A and 3B, respectively, the presence or absence of skew may not be considered to be of significance. Where, as shown in FIGS. 3A and 3B, however, the input signals comprise mutually dependent I and Q signal pairs, correcting skew for those pairs may be an important aspect of signal processing.

According to the embodiments of FIGS. 3A and 3B, skew is compensated for by baseband processor 328, which is additionally configured to account for the misalignment of the I and Q sampling times. There are many ways to account for the misalignment. For example, linear interpolation can be used, i.e., by averaging the values of the Q sample at time t/2 and 3t/2, the value of the Q sample at time t can be approximated. Linear interpolation is provided as a specific example at this juncture because it is the simplest to describe. It is merely an exemplary representation of an approach to correcting for skew, however. For example, in many embodiments, a combination of linear interpolation and matched filtering may be seen to provide superior results when compared to linear interpolation alone. Other interpolation methods known to those skilled in the art may be used as well.

Figure 4:
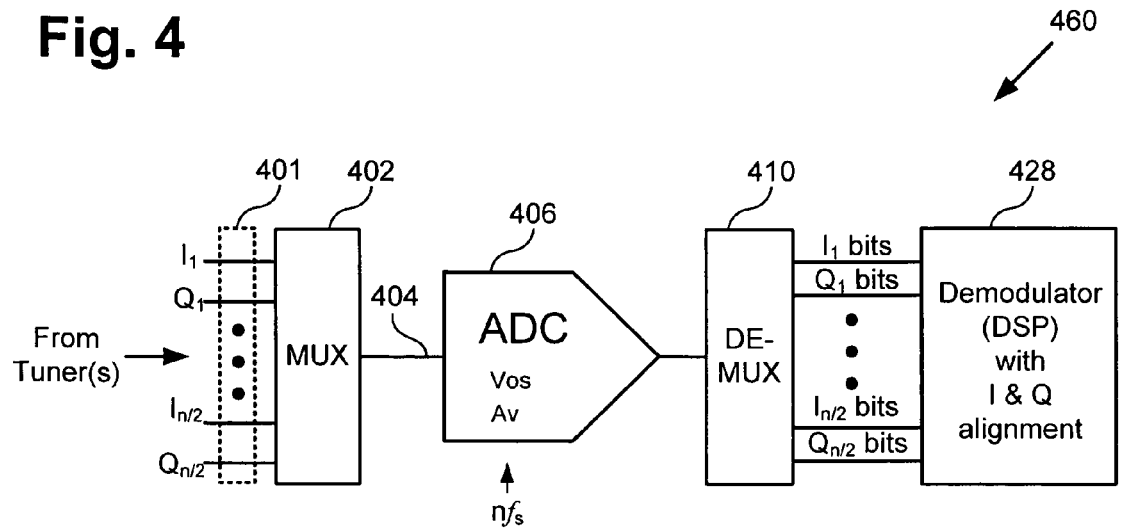
FIG. 4 is a block diagram showing a multi-channel demodulator system utilizing a single high speed ADC, according to one embodiment of the present invention.

Turning now to FIG. 4, FIG. 4 shows demodulator 460 equipped to demodulate multiple input signals utilizing a single high speed ADC. FIG. 4 shows a plurality 401 of analog I and Q signal inputs to multi-channel demodulator 460, where the plurality is specified by the integer n, i.e. the n/2 I input signals and n/2 Q input signals sum to a total of n inputs. The plurality of n input signals are multiplexed by MUX 402. Multiplexed output 404 is then sampled by shared ADC 406 operating at a multi-signal sampling rate substantially equal to n times a single signal sampling rate of an equivalent demodulator operating with a plurality of n ADCs. For example, if four sets of I and Q channels are sampled, corresponding to eight input signals to multi-channel demodulator 460, the multi-signal sampling rate should be $8f_s$.

Sampling of the multiplexed input signals by shared ADC 460 produces an interleaving of the I and Q samples. The resultant sampling is separated by DEMUX 410, which yields a plurality of I and Q bitstreams corresponding to the input I and Q analog signals. The plurality of I and Q bitstreams are then processed by baseband processor 428. Where, as in the present embodiment, the plurality of input signals comprise pairs of mutually dependent signals, such as the I and Q analog input pairs formed from respective communication signals, baseband processor 428 is configured to adjust the timing alignment of the output bit streams. Adjustment of the timing alignment is performed to correct for the multi-signal sampling delay, or skew, introduced by shared ADC 406 operating at the multi-signal sampling rate. The timing alignment is applied to eliminate a timing difference between I and Q bitstreams, or the digital outputs, introduced by multiplexing the I analog signal and the Q analog signal.

Comparison of the embodiment of FIG. 4 with those of FIGS. 3A and 3B shows that shared ADC 406, in FIG. 4, may be required to operate at significantly higher sampling rates than is required of shared ADC 306. As is well known in the art, increases in the sampling rate of an ADC are often associated with loss of resolution in the analog-to-digital conversion process. To overcome the loss of resolution due to the multiplication of the sampling rate for a shared ADC implemented in a multi-channel demodulator, such as demodulator 460, faster ADC architectures must be employed.

Figure 5:
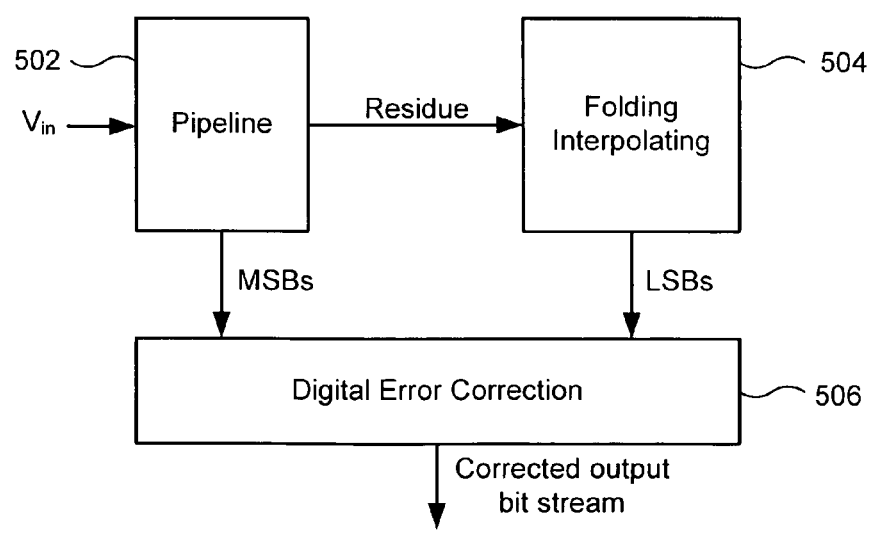
FIG. 5 is a block diagram showing an exemplary architecture for implementing a high speed ADC.

FIG. 5 shows an exemplary ADC architecture suitable for use in the demodulator systems of FIGS. 3A, 3B, and 4. FIG. 5 is a block diagram of an exemplary architecture for implementing a high speed ADC. The exemplary architecture shown in FIG. 5 utilizes a multi-step converter technology capable of achieving the higher sampling rates while providing adequate resolution.

Referring to FIG. 5, the analog signal to be sampled ($V_{in}$) is received by front-end 502 which employs a pipeline architecture with an embedded sample-and-hold circuit. Front-end 502 may be used to determine the most significant bits (MSB) of the signal, passing along the residue of the input for additional sampling. That residue may be received by back-end sub-ADC 504 which can digitize the residue to yield the least significant bits (LSB) of the signal. Back-end sub-ADC 504 may employ a folding-interpolating architecture, for example, which provides small-area and high-speed conversion for an intermediate number of resolution bits. The resultant raw MSBs and LSBs can then be re-combined by a digital error-correction circuit 506, which smoothes out any gross error at the interface of the two blocks to produce the corrected output digital stream shown at the bottom of FIG. 5.

As mentioned previously, the embodiment of FIG. 5 is merely exemplary. Other high-speed architectures for ADCs can also be employed. Examples of other suitable ADC architectures include flash, multi-step, and hybrid converter technologies, or any combination of those technologies.

Figure 6:
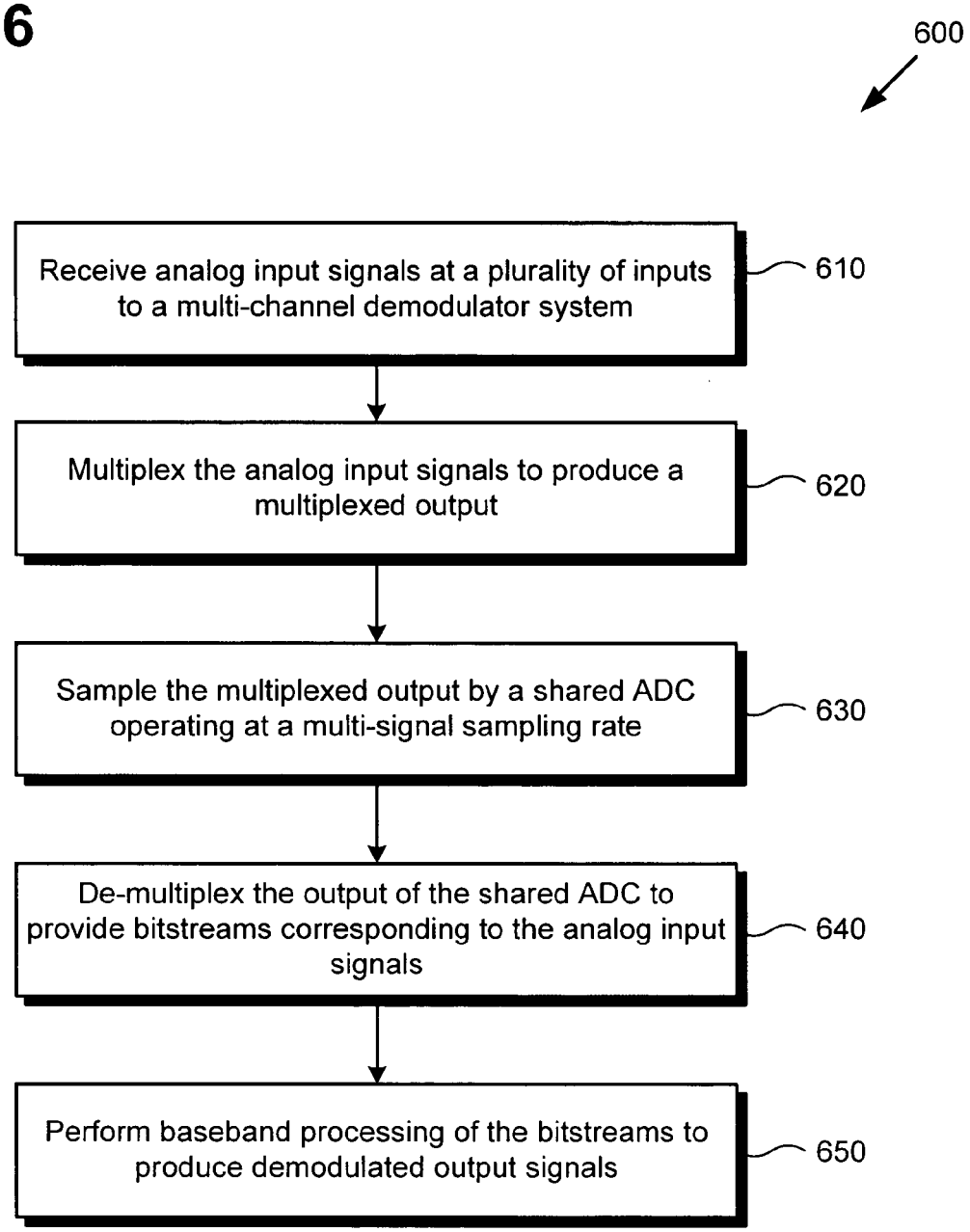
FIG. 6 is a flowchart presenting a method for demodulating multiple input signals utilizing a shared ADC, according to one embodiment of the present invention.

The present invention will now be further described by FIG. 6, which presents flowchart 600 describing an exemplary method of demodulating multiple input signals utilizing a shared ADC. Certain details and features have been left out of flowchart 600 that are apparent to a person of ordinary skill in the art. For example, a step may consist of one or more substeps or may involve specialized equipment or materials, as known in the art. While steps 610 through 650 in FIG. 6 are sufficient to describe a particular embodiment of the present method, other embodiments may utilize steps different from those shown in flowchart 600, or may include more, or fewer steps.

Referring to step 610 of flowchart 600 and consulting FIG. 4, step 610 comprises receiving analog input signals at a plurality of inputs to a multi-channel demodulator system. Step 610 corresponds, in FIG. 4, to receipt of plurality 401 of analog input signals by multi-channel demodulator system 460. As discussed in the previous description of FIG. 4, the plurality of inputs is specified by the integer n. Where, for example, the inputs comprise mutually dependent pairs, such as I and Q inputs received from a tuner implemented in a satellite set-top box, the I inputs may number from $I_1$ to $I_{n/2}$ and the Q inputs may similarly number from $Q_1$ to $Q_{n/2}$.

Alternatively, where the input signals are mutually independent, such as where the multi-channel demodulator receives a plurality of inputs from digital cable television tuners, for example, those independent inputs may number 1 through n. Because the plurality of input signals may be mutually independent, the integer n may assume both even and odd values. For inputs comprising mutually dependent pairs, of course, the integer n will be even. As shown by FIGS. 3A and 3B, in some embodiments, n equals two.

Continuing with step 620 of flowchart 600 and FIG. 4, step 620 comprises multiplexing the analog input signals to produce multiplexed output 404 for sampling. Referring to FIG. 4, use of MUX 402 enables ADC 406 to be shared by plurality 401 of input signals. Although not included in the present embodiment, in some embodiments a method of demodulating multiple input signals utilizing a shared ADC may include utilizing a sample-and-hold circuit, such as sample-and-hold circuit 305 in FIG. 3B, to couple the output of the MUX to the shared ADC. In those embodiments, use of a MUX in step 620 permits a single sample-and-hold circuit to be shared by multiple input signals.

The exemplary method of flowchart 600 continues with step 630, which comprises sampling multiplexed output 404 of MUX 402 by shared ADC 406 configured to operate at a multi-signal sampling rate. As previously explained, for n inputs, the multi-signal sampling rate is substantially equal to n times a single signal sampling rate required to sample one input signal. The sampled output of shared ADC 406 is then de-multiplexed by DEMUX 410, at step 640, to provide bitstreams corresponding to the analog input signals received at step 610.

Moving now to step 650 of flowchart 600, step 650 comprises performing baseband processing of the bitstreams to produce demodulated output signals corresponding to the analog input signals received at the plurality of inputs. Where, as in the embodiment of FIG. 4, the plurality 401 of input signals comprise mutually dependent pairs of I and Q signals, baseband processing in step 650 may include adjusting the timing alignment of the bitstreams provided by DEMUX 410, to correct for the multi-signal sampling delay introduced by shared ADC 406 operating at the multi-signal sampling rate. Adjustment of the timing alignment corresponds to correction for the skew introduced by sampling the respective multiplexed input signals at different times. As explained previously, adjusting the timing alignment may be achieved using a linear interpolation method, linear interpolation in combination with matched filtering, or any other suitable method for correcting skew. As also previously noted, adjusting the timing alignment in step 650 may not be necessary in all situations. Where plurality 401 of inputs includes only mutually independent inputs, for example, baseband processing at step 650 may proceed without adjusting the timing alignment of the bitstreams.

Thus, the present application discloses a system and method for demodulating multiple input signals utilizing a shared ADC. By utilizing a multiplexer to deliver a plurality of analog input signals to a shared ADC, the present disclosure describes a demodulation solution that avoids the large circuit area consumption and power demands of conventional implementations using multiple ADCs and or multiple sample-and-hold circuits. By implementing a single ADC capable of operating at a multi-signal sampling rate substantially equal to n times a single signal sampling rate, where n specifies the number of inputs to the demodulator system, one disclosed embodiment enables the resource savings achievable through use of a shared ADC, while providing adequate resolution at high speed. By further adjusting a timing alignment of the bitstreams de-multiplexed from the shared ADC, various embodiments disclosed in the present application make it possible to concurrently process mutually dependent input signals, such as mutually dependent pairs comprising the I and Q components of a received communication signal.

Furthermore, the solution disclosed by the present application successfully avoids the substantial disadvantages introduced by performance mismatch of duplicative but non-identical components in conventional demodulator implementations. For example, because in one embodiment the present disclosure describes a solution requiring a shared ADC, the performance problems due to variations in offset voltage or converter gain amongst multiple ADCs in the conventional art are absent. In addition, because in one embodiment the present disclosure describes a solution utilizing a MUX in lieu of multiple sample-and-hold circuits, the performance problems arising in conventional approaches from use of those imperfectly matched circuits is avoided as well. Moreover, it is noted that these latter significant advantages are additive to the aforementioned reductions in circuit area utilization and power consumption enabled by the various embodiments described by the present disclosure.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, it is contemplated that the circuitry disclosed herein can be implemented in software, or vice versa. The described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A demodulating method comprising:
   receiving a first analog signal at a first rate;
   receiving a second analog signal at the first rate;
   multiplexing the first analog signal and the second analog signal to generate a multiplexed analog output;
   applying an analog-to-digital conversion (ADC) to the multiplexed analog output to generate a multiplexed digital output, the ADC being applied at a second rate, wherein the second rate is substantially equal to the first rate multiplied by a total number of input analog signals; and
   demultiplexing the multiplexed digital output to generate a first digital output having a first bitstream and a second digital output having a second bitstream corresponding to the first analog signal and the second analog signal, respectively;
   wherein applying the ADC conversion includes:
      determining, using a front-end, the most significant bits (MSB) of the multiplexed analog output and generating a residue;
      receiving, using a back-end, the residue and determining the least significant bits (LSB) of the multiplexed analog output;
      combining the MSB and the LSB using a digital error-correction circuit to generate the multiplexed digital output.

2. The method of claim 1 wherein the first analog signal is an in-phase (I) analog signal and the second analog signal is a quadrature-phase (Q) analog signal.

3. The method of claim 2 further comprising:
   eliminating a timing difference between the first digital output and the second digital output introduced by multiplexing the I analog signal and the Q analog signal to generate the multiplexed analog output.

4. The method of claim 1, wherein the second rate is two times the first rate.

5. The method of claim 1 further comprising:
   sampling-and-holding the multiplexed analog output prior to applying the ADC conversion, wherein the sampling-and-holding utilizes a single sample-and-hold circuit.

6. The method of claim 1 further comprising:
   receiving a third analog signal at the first rate; and
   receiving a fourth analog signal at the first rate,
   wherein the multiplexing includes multiplexing the first analog signal, the second analog signal, the third analog signal and the fourth analog signal to generate the multiplexed analog output.

7. The method of claim 6, wherein the first and second analog signals and the third and fourth analog signals are pairs of mutually dependent signals.

8. A demodulator system comprising:
   a first input configured to receive a first analog signal at a first rate;
   a second input configured to receive a second analog signal at the first rate;
   a multiplexer (MUX) coupled to the first input and the second input and configured to receive the first analog signal and the second analog signal, and further configured to multiplex the first analog signal and the second analog signal to generate a multiplexed analog output;
   an analog-to-digital converter (ADC) configured to receive the multiplexed analog output and to generate a multiplexed digital output, the ADC being configured to operate at a second rate, wherein the second rate is substantially equal to the first rate multiplied by a total number of input analog signals; and
   a de-multiplexer (DEMUX) configured to receive the multiplexed digital output and to generate a first digital output having a first bitstream and a second digital output having a second bitstream corresponding to the first analog signal and the second analog signal, respectively;
   wherein the ADC includes:
      a front-end configured to determine the most significant bits (MSB) of the multiplexed analog output and generate a residue;
      a back-end configured to receive the residue and determine the least significant bits (LSB) of the multiplexed analog output;
      a digital error-correction circuit configured to combine the MSB and the LSB to generate the multiplexed digital output.

9. The demodulator system of claim 8 wherein the first analog signal is an in-phase (I) analog signal and the second analog signal is a quadrature-phase (Q) analog signal.

10. The demodulator system of claim 9 further comprising a processor configured to eliminate a timing difference between the first digital output and the Second digital output introduced by multiplexing the I analog signal and the Q analog signal to generate the multiplexed analog output.

11. The demodulator system of claim 8, wherein the second rate is two times the first rate.

12. The demodulator system of claim 8 further comprising:
   a sample-and-hold circuit, the sample-and-hold circuit configured to receive the multiplexed analog output from the MUX prior to providing the multiplexed analog output to the ADC.

13. The demodulator system of claim 12, wherein the sample-and-hold circuit is embedded in the ADC.

14. The demodulator system of claim 12, wherein the sample-and-hold circuit is a single sample-and-hold circuit configured to receive the multiplexed analog output from the MUX prior to providing the multiplexed analog output to the ADC.

15. The demodulator system of claim 8 further comprising:
a third input configured to receive a third analog signal at the first rate; and
a fourth input configured to receive a fourth analog signal at the first rate,
wherein the MUX is further configured to receive the third analog signal and the fourth analog signal, and further configured to multiplex the first analog signal, the second analog signal, the third analog signal and the fourth analog signal to generate the multiplexed analog output.

16. The demodulator system of claim 15, wherein the first and second analog signals and the third and fourth analog signals are pairs of mutually dependent signals.

* * * * *